US010601098B2

(12) United States Patent
Yoshimoto et al.

(10) Patent No.: US 10,601,098 B2
(45) Date of Patent: Mar. 24, 2020

(54) DIELECTRIC WAVEGUIDE LINE COMPRISING A POLYTETRAFLUOROETHYLENE MOLDED ARTICLE AND METHOD OF MANUFACTURE

(71) Applicant: DAIKIN INDUSTRIES, LTD., Osaka-shi, Osaka (JP)

(72) Inventors: Hiroyuki Yoshimoto, Osaka (JP); Kyouhei Murayama, Osaka (JP); Taku Yamanaka, Osaka (JP); Dai Fukami, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 51 days.

(21) Appl. No.: 15/552,320

(22) PCT Filed: Mar. 31, 2016

(86) PCT No.: PCT/JP2016/060827
§ 371 (c)(1),
(2) Date: Aug. 21, 2017

(87) PCT Pub. No.: WO2016/159314
PCT Pub. Date: Oct. 6, 2016

(65) Prior Publication Data
US 2018/0040936 A1    Feb. 8, 2018

(30) Foreign Application Priority Data
Mar. 31, 2015    (JP) ................. 2015-073369

(51) Int. Cl.
*H01P 3/16* (2006.01)
*C08J 5/00* (2006.01)
(Continued)

(52) U.S. Cl.
CPC ...... *H01P 3/16* (2013.01); *C08J 5/00* (2013.01); *C08J 5/18* (2013.01); *C08J 9/28* (2013.01);
(Continued)

(58) Field of Classification Search
CPC ........... H01P 3/16; H01P 11/006; H01P 3/165
(Continued)

(56) References Cited

U.S. PATENT DOCUMENTS 3,995,238 A  *  11/1976  Knox et al. ............... H01P 1/16
                                                            333/21 R
4,463,329 A        7/1984  Suzuki
(Continued)

FOREIGN PATENT DOCUMENTS

JP    53-99955 A    8/1978
JP    63-38884 B2   8/1988
(Continued)

OTHER PUBLICATIONS

International Preliminary Report on Patentability with translation of Written Opinion dated Oct. 3, 2017, issued by the International Searching Authority in application No. PCT/JP2016/060827.
(Continued)

*Primary Examiner* — Benny T Lee
(74) *Attorney, Agent, or Firm* — Sughrue Mion, PLLC

(57) ABSTRACT

The present invention provides a dielectric waveguide having excellent transmission efficiency. The dielectric waveguide includes a polytetrafluoroethylene molded article that has a permittivity of 2.05 or higher at 2.45 GHz or 12 GHz, a loss tangent of $1.20 \times 10^{-4}$ or lower at 2.45 GHz or 12 GHz, and a hardness of 95 or higher.

10 Claims, 2 Drawing Sheets

(51) Int. Cl.
*H01P 11/00* (2006.01)
*G01R 27/26* (2006.01)
*C08J 5/18* (2006.01)
*C08J 9/28* (2006.01)

(52) U.S. Cl.
CPC .............. *G01R 27/26* (2013.01); *H01P 3/165* (2013.01); *H01P 11/00* (2013.01); *H01P 11/006* (2013.01); *C08J 2201/03* (2013.01); *C08J 2201/0502* (2013.01); *C08J 2327/18* (2013.01)

(58) Field of Classification Search
USPC .......................................................... 333/239
See application file for complete search history.

(56) References Cited

U.S. PATENT DOCUMENTS

| | | | | |
|---|---|---|---|---|
| 4,603,942 A | * | 8/1986 | Chang et al. | ........ G02B 6/4415 333/241 |
| 4,785,268 A | * | 11/1988 | Walter et al. | ............. H01P 3/16 333/157 |
| 4,825,221 A | * | 4/1989 | Suzuki et al. | ............. H01P 3/16 333/239 |
| 2013/0021764 A1 | * | 1/2013 | Yeo et al. | ............. H01P 11/002 361/760 |
| 2014/0240062 A1 | | 8/2014 | Herbsommer et al. | |

FOREIGN PATENT DOCUMENTS

| | | |
|---|---|---|
| JP | 10-123072 A | 5/1998 |
| JP | 2000-021250 A | 1/2000 |
| JP | 2002-157930 A | 5/2002 |

OTHER PUBLICATIONS

Communication dated Jun. 15, 2018, from the European Patent Office in counterpart European Application No. 16773194.2.
Nafaa Mekhilef, "Viscoelastic and Pressure-Volume-Temperature Properties of Poly(vinylidene fluoride) and Poly(vinylidene fluoride)-Hexafluoropropylene Copolymers", Journal of Applied Poylmer Science, Apr. 11, 2001, vol. 80, pp. 230-241, XP055481999 (12 pages total).
Naokazu Koizumi et al., "Dielectric Properties of Polytetrafluoroethylene and Tetrafluoroethylene-Hexafluoropropylene Copolymer", Journal of Polymer Science: Part C, 1968, No. 23, pp. 499-508 (10 pages total).
Bill Riddle et al., "Complex Permittivity Measurements of Common Plastics Over Variable Temperatures", IEEE Transactions on Microwave Theory and Techniques, Mar. 2003, pp. 727-733, vol. 51, No. 3.
International Search Report for PCT/JP2016/060827 dated Jun. 28, 2016 [PCT/ISA/210].

* cited by examiner

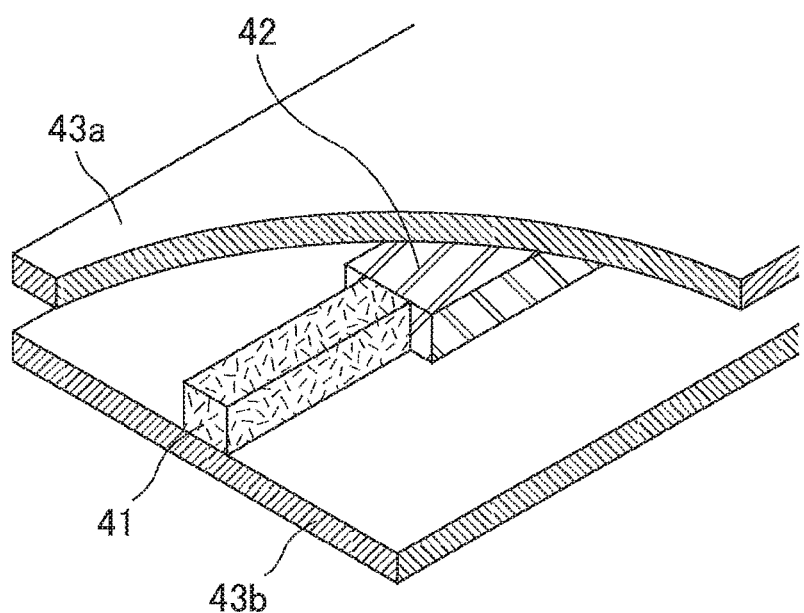

DIELECTRIC WAVEGUIDE LINE COMPRISING A POLYTETRAFLUOROETHYLENE MOLDED ARTICLE AND METHOD OF MANUFACTURE

CROSS REFERENCE TO RELATED APPLICATIONS

This application is a National Stage of International Application No. PCT/JP2016/060827 filed Mar. 31, 2016, claiming priority based on Japanese Patent Application No. 2015-073369 filed Mar. 31, 2015, the contents of all of which are incorporated herein by reference in their entirety.

TECHNICAL FIELD

The present invention relates to dielectric waveguides including a polytetrafluoroethylene molded article.

BACKGROUND ART

Dielectric loss always occurs in cables that transmit high-frequency signals, such as coaxial cables and LAN cables. Such dielectric loss in cables configured to transmit high-frequency signals can be reduced using polytetrafluoroethylene. Use of polytetrafluoroethylene as an insulating coating layer material of a cable configured to transmit high-frequency signals has therefore been suggested.

For example, Patent Literature 1 discloses a semi-rigid type coaxial cable including a center conductor; a porous tetrafluoroethylene resin insulating layer formed on the outer periphery of the center conductor and having been heat-treated to have a surface crystallinity of 75 to 92% and a porosity as the whole insulating layer of 5 to 30%; and an outer metal conductor layer including an electroless plating anchor metal layer and an electroplating metal layer formed in the given order on the porous tetrafluoroethylene resin insulating layer.

Patent Literature 2 discloses that in use of polytetrafluoroethylene as an insulating coating layer material, the heating treatment level for polytetrafluoroethylene needs to be controlled in order to balance the electric characteristics (e.g., permittivity, loss tangent) with the other characteristics (e.g., processability).

Patent Literature 1 and Patent Literature 2 each disclose use of polytetrafluoroethylene as an insulating coating layer material of high-frequency signal transmission cables which employ a metallic material for the core wire. A problem of these high-frequency signal transmission cables including a metallic material as the core wire is that attenuation is too high to transmit millimeter waves and submillimeter waves, though they can transmit microwaves having long wavelengths. A known technique to solve this problem is to use a polytetrafluoroethylene molded article for a waveguide configured to transmit millimeter waves and submillimeter waves.

For example, Patent Literature 3 discloses a transmission line including a rod-like center dielectric made of sintered stretched polytetrafluoroethylene with continuous pores, and a dielectric layer in which stretched polytetrafluoroethylene tape with continuous pores is wound onto the outer periphery of the center dielectric.

Patent Literature 4 discloses use of an unsintered or semi-sintered polytetrafluoroethylene molded article to form a wave energy transmission portion of a dielectric waveguide configured to transmit millimeter waves and submillimeter waves.

CITATION LIST

Patent Literature

Patent Literature 1: JP 2000-21250 A
Patent Literature 2: JP 2002-157930 A
Patent Literature 3: JP S63-38884 B
Patent Literature 4: JP H10-123072 A

SUMMARY OF THE INVENTION

Technical Problem

In view of such a current state of the art, the present invention aims to provide a dielectric waveguide with excellent transmission efficiency.

Solution to the Problem

Dielectric waveguides for transmission of millimeter waves and submillimeter waves need to include a center portion formed of a high-permittivity material and an outer layer formed of a low-permittivity material. It is known in the field of optical fibers that an optical fiber includes an inner layer and an outer layer, and an increase in refractive index difference between the inner layer and the outer layer increases the effect of light signal confinement, thereby achieving excellent transmission efficiency. The inventors, based on this known fact, have developed a hypothesis that increasing the permittivity difference between the center portion and the outer layer of a dielectric waveguide would increase the effect of electromagnetic wave confinement to lead to higher transmission efficiency. In order to achieve such high transmission efficiency, a low loss tangent to give reduced attenuation is required as well as an increased permittivity difference.

Studies on polytetrafluoroethylene molded articles have been made to decrease both the permittivity and the loss tangent from the typically expected permittivity and loss tangent of polytetrafluoroethylene. Hence, no attempts have been made to obtain a polytetrafluoroethylene molded article having a low loss tangent as well as a high permittivity. The inventors have nevertheless succeeded in the manufacture of such a polytetrafluoroethylene molded article having a high permittivity and a low loss tangent. The present invention has been completed based on that success.

One aspect of the present invention is a dielectric waveguide comprising a polytetrafluoroethylene molded article that has a permittivity of 2.05 or higher at 2.45 GHz or 12 GHz, a loss tangent of $1.20 \times 10^{-4}$ or lower at 2.45 GHz or 12 GHz, and a hardness of 95 or higher (this dielectric waveguide may also be referred to as a "first dielectric waveguide" herein).

The polytetrafluoroethylene molded article is preferably obtained by heating unsintered polytetrafluoroethylene at 326° C. to 345° C. for 10 seconds to two hours.

The dielectric waveguide preferably further comprises a dielectric layer surrounding the polytetrafluoroethylene molded article that functions as a center dielectric, wherein the dielectric layer is formed of a material that has a permittivity of 1.90 or lower at 2.45 GHz or 12 GHz and a loss tangent of $2.00 \times 10^{-4}$ or lower at 2.45 GHz or 12 GHz.

The dielectric waveguide preferably further comprises a conductive substrate, and a dielectric formed of a material having a lower permittivity than the polytetrafluoroethylene molded article, wherein the polytetrafluoroethylene molded article is disposed on the conductive substrate with the dielectric in between.

The dielectric waveguide preferably further comprises a pair of conductive plates, wherein the polytetrafluoroethylene molded article is held between the conductive plates.

Another aspect of the present invention is a method for manufacturing a dielectric waveguide, comprising the steps of: heating unsintered polytetrafluoroethylene at 326° C. to 345° C. for 10 seconds to two hours and thereby forming a polytetrafluoroethylene molded article; and manufacturing a dielectric waveguide using the polytetrafluoroethylene molded article.

Yet another aspect of the present invention is a dielectric waveguide comprising: a dielectric A; and a dielectric B having a lower permittivity than the dielectric A, the dielectric A being formed of a polytetrafluoroethylene molded article, the dielectric waveguide having a $\Delta \varepsilon$ value, determined from $\Delta \varepsilon = \varepsilon_A - \varepsilon_B$, of 0.70 or higher, wherein EA represents a permittivity of the dielectric A at 2.45 GHz or 12 GHz, $\varepsilon_B$ represents a permittivity of the dielectric B at 2.45 GHz or 12 GHz, and $\Delta \varepsilon$ represents a permittivity difference between the dielectric A and the dielectric B (this dielectric waveguide may also be referred to as a "second dielectric waveguide" herein).

The second dielectric waveguide preferably has a $\Delta \varepsilon$ value of 0.90 or higher.

In the second dielectric waveguide, EA is preferably 2.05 or higher.

In the second dielectric waveguide, the dielectric A preferably has a loss tangent of $1.20 \times 10^{-4}$ or lower at 2.45 GHz or 12 GHz and a hardness of 95 or higher.

Advantageous Effects of the Invention

While conventional polytetrafluoroethylene molded articles have a permittivity and a loss tangent, both of which are low, the inventors succeeded in manufacturing a polytetrafluoroethylene molded article having a high permittivity and a low loss tangent.

The first dielectric waveguide of the present invention comprises a polytetrafluoroethylene molded article having a high permittivity and a low loss tangent, and therefore has high transmission efficiency for millimeter waves and submillimeter waves.

The second dielectric waveguide of the present invention has the above configuration, and thus has high transmission efficiency for millimeter waves and submillimeter waves.

BRIEF DESCRIPTION OF THE DRAWINGS

FIG. 4 is a schematic view of a nonradiative dielectric waveguide.

DETAILED DESCRIPTION OF THE PREFERRED EMBODIMENTS

Hereinafter, the present invention is described in detail.

The first dielectric waveguide of the present invention comprises a polytetrafluoroethylene (PTFE) molded article that has a permittivity of 2.05 or higher at 2.45 GHz or 12 GHz, a loss tangent of $1.20 \times 10^{-4}$ or lower at 2.45 GHz or 12 GHz, and a hardness of 95 or higher.

The permittivity is preferably 2.10 or higher, more preferably 2.16 or higher. The upper limit thereof may be, but is not particularly limited to, 2.30.

The loss tangent (tan δ) is preferably $1.00 \times 10^{-4}$ or lower, more preferably $0.95 \times 10^{-4}$ or lower. The lower limit of the loss tangent (tan δ) may be, but is not particularly limited to, $0.10 \times 10^{-4}$ or $0.80 \times 10^{-4}$.

Figure 1:
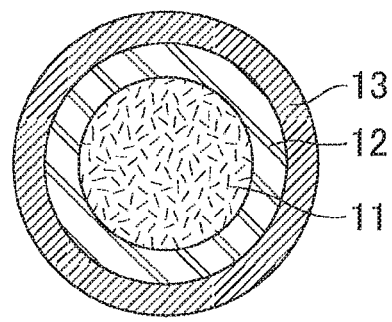
FIG. 1 is a schematic view of a cross section of a cylindrical dielectric waveguide.

The dielectric waveguide can comprise the PTFE molded article as the center dielectric. The dielectric waveguide preferably further comprises a dielectric layer surrounding the center dielectric, wherein the dielectric layer is formed of a material that has a permittivity of 1.90 or lower at 2.45 GHz or 12 GHz and a loss tangent of $2.00 \times 10^{-4}$ or lower at 2.45 GHz or 12 GHz. One example of this preferred mode is illustrated in FIG. 1.

A proper diameter for the center dielectric depends on the frequency and the permittivity of the center dielectric. Typically, the proper diameter is 0.1 mm to 100 mm in the case where the frequency is 1 GHz to 1 THz.

Figure 2:
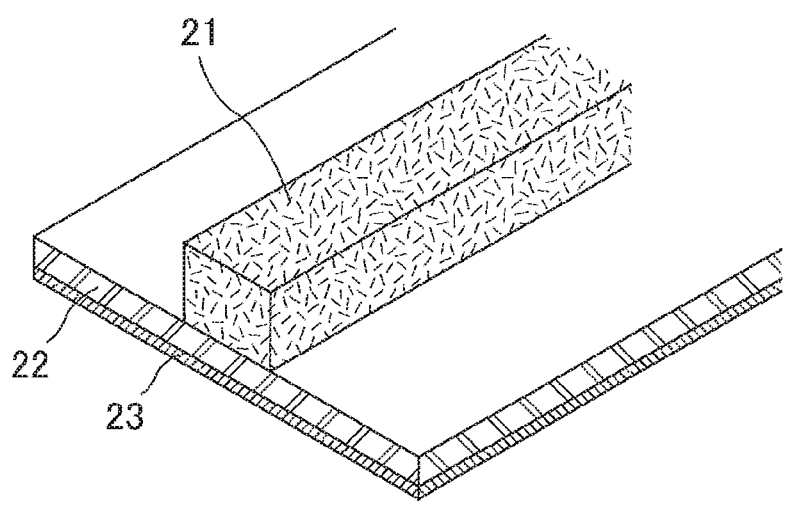
FIG. 2 is a schematic view of an insular-image guide.

The dielectric waveguide may be one comprising, as well as the PTFE molded article, a conductive substrate and a dielectric formed of a material having a lower permittivity than the PTFE molded article. Here, the PTFE molded article is preferably disposed on the conductive substrate with the dielectric in between. The conductive substrate may be a metal plate. The dielectric is preferably one formed of a material having a permittivity of 1.90 or lower at 2.45 GHz or 12 GHz and a loss tangent of $2.00 \times 10^{-4}$ or lower at 2.45 GHz or 12 GHz. One example of this preferred mode is illustrated in FIG. 2.

Figure 3:
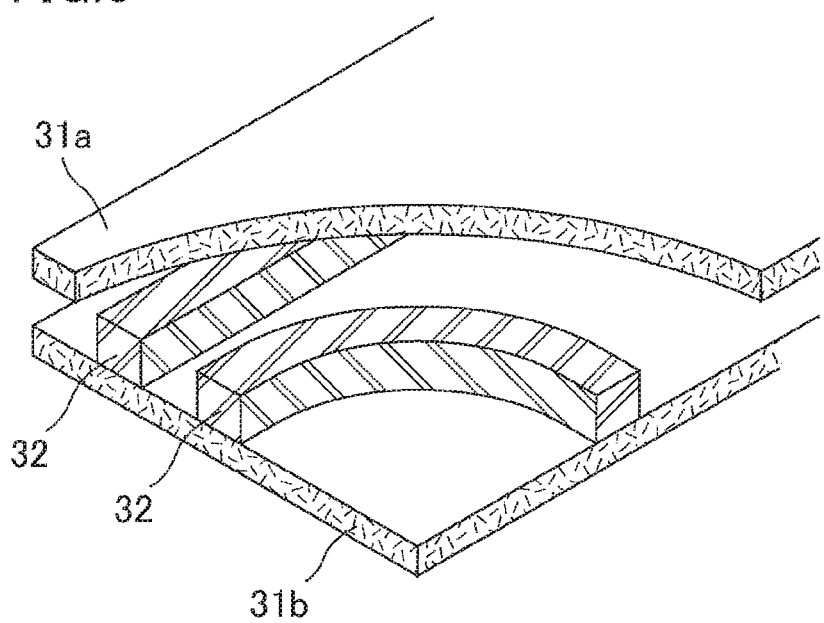
FIG. 3 is a schematic view of a nonradiative dielectric waveguide.

The dielectric waveguide may be one comprising a pair of conductive plates as well as the PTFE molded article. Here, the PTFE molded article is preferably held between the conductive plates. Also, the dielectric waveguide may further comprise a dielectric that is held between the conductive plates and is formed of a material having a lower permittivity than the PTFE molded article. The conductive plate may be a metal plate. The dielectric is preferably one formed of a material having a permittivity of 1.90 or lower at 2.45 GHz or 12 GHz and a loss tangent of $2.00 \times 10^{-4}$ or lower at 2.45 GHz or 12 GHz. Examples of these respective preferred modes are illustrated in FIG. 3 and FIG. 4.

The second dielectric waveguide of the present invention comprises: a dielectric A; and a dielectric B having a lower permittivity than the dielectric A, the dielectric waveguide having a $\Delta \varepsilon$ value, determined from $\Delta \varepsilon = \varepsilon_A - \varepsilon_B$, of 0.70 or higher, wherein $\varepsilon_A$ represents a permittivity of the dielectric A at 2.45 GHz or 12 GHz, re represents a permittivity of the dielectric B at 2.45 GHz or 12 GHz, and $\Delta \varepsilon$ represents a permittivity difference between the dielectric A and the dielectric B. The second dielectric waveguide of the present invention can transmit high-frequency waves such as millimeter waves and submillimeter waves by utilizing the permittivity difference between the dielectric A and the dielectric B. With the permittivity difference of 0.70 or higher, the second dielectric waveguide has very high transmission efficiency.

The Δε value is preferably 0.90 or higher, more preferably 1.00 or higher, still more preferably 1.10 or higher, in terms of the transmission efficiency. The upper limit thereof may be 1.50.

The $\varepsilon_A$ value is preferably 2.05 or higher, more preferably 2.10 or higher, still more preferably 2.16 or higher, in terms of the transmission efficiency. The upper limit thereof may be, but is not particularly limited to, 2.30.

The loss tangent of the dielectric A at 2.45 GHz or 12 GHz is preferably $1.20 \times 10^{-4}$ or lower, more preferably $1.00 \times 10^{-4}$ or lower, still more preferably $0.95 \times 10^{-4}$ or lower. The lower limit thereof may be, but is not particularly limited to, $0.10 \times 10^{-4}$ or $0.80 \times 10^{-4}$. The hardness of the dielectric A is preferably 95 or higher.

The dielectric A is formed of a PTFE molded article. In order to easily provide a permittivity difference (Δε), the PTFE molded article is preferably the same as the PTFE molded article constituting the first dielectric waveguide. A dielectric waveguide with this configuration can achieve high transmission efficiency due to the permittivity difference (Δε), and achieve even higher transmission efficiency for high-frequency waves due to the high permittivity and low loss tangent of the dielectric A.

The permittivity of the dielectric B at 2.45 GHz or 12 GHz is preferably 1.50 or lower, more preferably 1.43 or lower, still more preferably 1.35 or lower, particularly preferably 1.30 or lower, while it is also preferably 1.03 or higher.

The loss tangent of the dielectric B at 2.45 GHz or 12 GHz is preferably $1.00 \times 10^{-4}$ or lower, more preferably $0.60 \times 10^{-4}$ or lower, still more preferably $0.30 \times 10^{-4}$ or lower.

Examples of the material constituting the dielectric B include stretched PTFE porous materials and foamed polyethylene.

A common preferred mode for the PTFE molded articles constituting the respective first and second dielectric waveguides is described in detail.

In the case where the PTFE molded article has a cylindrical or tubular shape, the permittivity and loss tangent of the molded article are measured at 2.45 GHz using a cavity resonator from Kanto Electronic Application and Development Inc.

In the case where the PTFE molded article has a flat plate shape, the permittivity and loss tangent are measured at 12 GHz in accordance with "Microwave measurement of complex permittivity of dielectric plate materials", Prof. Kobayashi (Saitama University), MW87-7.

The PTFE molded article preferably has a specific gravity of 2.160 or higher, more preferably 2.165 or higher, still more preferably 2.170 or higher. The upper limit thereof may be, but is not particularly limited to, 2.30. The PTFE molded article having a specific gravity within the above range can have a low loss tangent as well as a high permittivity.

The specific gravity is measured by hydrostatic weighing (in accordance with JIS Z 8807).

The PTFE molded article preferably has a crystallinity of 70% or higher, more preferably 73% or higher, still more preferably 75% or higher. The upper limit thereof may be, but is not particularly limited to, 99%. The PTFE molded article having a crystallinity within the above range can have a low loss tangent as well as a high permittivity.

The crystallinity is measured by the specific gravity method.

The PTFE molded article preferably has a hardness of 97 or higher, more preferably 98 or higher, still more preferably 99 or higher. The upper limit thereof may be, but is not particularly limited to, 99.9. The molded article having a hardness within the above range can have a low loss tangent as well as a high permittivity. Also, application of this PTFE molded article to a dielectric waveguide is not likely to cause breaking, clogging (in relation to the structure of a dielectric waveguide (e.g., in cylindrical form)), or bending of the dielectric waveguide.

The hardness is a JIS A hardness which is measured with a spring-type hardness meter (JIS-A shaped) defined in JIS K6301-1975.

The PTFE molded article contains PTFE. The PTFE may be a homopolymer of TFE or a modified PTFE modified with another monomer.

The modified PTFE is PTFE containing tetrafluoroethylene (TFE) and a monomer (hereinafter, also referred to as a modifier) other than TFE. The modified PTFE may be uniformly modified or may have the later-described core-shell structure.

The modified PTFE has TFE units based on TFE and modifier units based on the modifier. The modifier units preferably constitute 0.005 to 1% by mass, more preferably 0.02 to 0.5% by mass, of the whole monomer units.

The term "modifier unit" as used herein means a repeating unit that constitutes part of the molecular structure of the modified PTFE and is derived from the comonomer used as the modifier. The modifier unit is represented by —[CF$_2$—CF(—OC$_3$F$_7$)]— in the case where perfluoropropyl vinyl ether is used as the modifier, and is represented by —[CF$_2$—CF(—CF$_3$)]— in the case where hexafluoropropylene is used as the modifier, for example.

The modifier may be any modifier copolymerizable with TFE. Examples thereof include perfluoroolefins such as hexafluoropropylene (HFP); chlorofluoroolefins such as chlorotrifluoroethylene (CTFE); hydrogen-containing fluoroolefins such as trifluoroethylene and vinylidene fluoride (VDF); perfluorovinyl ethers; perfluoroalkyl ethylenes, and ethylene. A single modifier or multiple modifiers may be used.

Examples of the perfluorovinyl ethers include, but are not particularly limited to, perfluoro unsaturated compounds represented by the following formula:

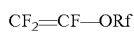

wherein Rf represents a perfluoro organic group. The term "perfluoro organic group" as used herein means an organic group in which all the hydrogen atoms bonded to the carbon atoms are replaced by fluorine atoms. The perfluoro organic group may contain ether oxygen.

The examples of the perfluorovinyl ethers also include a perfluoro(alkyl vinyl ether) (PAVE) wherein Rf in the above formula is a C1-C10 perfluoroalkyl group. The number of carbon atoms in the perfluoroalkyl group is preferably 1 to 5.

Examples of the perfluoroalkyl group in the PAVE include perfluoromethyl, perfluoroethyl, perfluoropropyl, perfluorobutyl, perfluoropentyl, and perfluorohexyl groups. The perfluoroalkyl group is preferably a perfluoropropyl group. In other words, the PAVE is preferably perfluoropropyl vinyl ether (PPVE).

The examples of the perfluorovinyl ethers also include those wherein Rf in the above formula is a C4-C9 perfluoro(alkoxyalkyl) group, those wherein Rf is a group represented by the following formula:

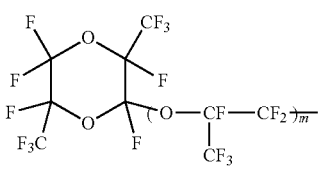

wherein m is 0 or an integer of 1 to 4, and those wherein Rf is a group represented by the following formula:

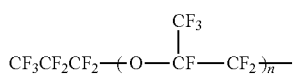

wherein n is an integer of 1 to 4.

Examples of the perfluoroalkyl ethylenes (PFAE) include, but are not particularly limited to, (perfluorobutyl)ethylene (PFBE) and (perfluorohexyl)ethylene.

The modifier in the modified PTFE is preferably one selected from the group consisting of HFP, CTFE, VDF, PAVE, PFAE, and ethylene. More preferred is PAVE, and still more preferred is PPVE.

The modified PTFE may have a core-shell structure consisting of a particle core and a particle shell.

The PTFE preferably has fibrillability, which is generally used in fiber technology to define a tendency to split up under the influence of a given transversely acting force. Whether or not the PTFE has fibrillability can be determined by "paste extrusion" which is a representative method for molding "high molecular weight PTFE powder" (powder produced from a TFE polymer). Typically, paste extrusion is enabled by the fibrillability of PTFE having a high molecular weight. In the case where an unsintered molded article obtained by paste extrusion has no substantial strength or elongation, e.g., in the case where the molded article has an elongation of 0% and is cut by pulling, the PTFE can be considered to have no fibrillability.

The PTFE preferably has non-melt-fabricability. The non-melt-fabricability means that the melt flow rate cannot be measured in accordance with ASTM D-1238 and D-2116 at temperatures higher than the crystallization temperature/melting point.

The PTFE preferably has a standard specific gravity (SSG) of 2.13 to 2.23, more preferably 2.15 to 2.19. The standard specific gravity is a value measured by the water displacement method in accordance with ASTM D-4895 98.

The PTFE preferably has a first melting point of 333° C. to 347° C., more preferably 335° C. to 345° C. The first melting point is the temperature corresponding to the maximum on a heat-of-fusion curve when PTFE having never been heated up to 300° C. or higher is heated using a differential scanning calorimeter (DSC) at a temperature-increasing rate of 10° C./min.

The PTFE may be a combination of high molecular weight PTFE and low molecular weight PTFE. The high molecular weight PTFE preferably has a first melting point of 333° C. to 347° C., more preferably 335° C. to 345° C. The low molecular weight PTFE preferably has a first melting point of 322° C. to 333° C., more preferably 324° C. to 332° C. The first melting point is the temperature corresponding to the maximum on a heat-of-fusion curve when PTFE having never been heated up to 300° C. or higher is heated using a differential scanning calorimeter (DSC) at a temperature-increasing rate of 10° C./min.

The ratio by mass between the high molecular weight PTFE and the low molecular weight PTFE is preferably 80/20 to 99/1, more preferably 85/15 to 97/3, still more preferably 90/10 to 95/5.

The PTFE molded article may be a molded article formed of PTFE and a resin other than the PTFE. Examples of the resin other than the PTFE include TFE/hexafluoropropylene (HFP) copolymers (FEP), TFE/perfluoro(alkyl vinyl ether) (PAVE) copolymers (PFA), ethylene/TFE copolymers (ETFE), polyvinylidene fluoride (PVdF), polychlorotrifluoroethylene (PCTFE), polypropylene, and polyethylene.

The PTFE molded article may contain any other components. Examples of the other components include surfactants, antioxidants, light stabilizers, fluorescent brighteners, colorants, pigments, dyes, and fillers. The examples also include powder or fibrous powder of carbon black, graphite, alumina, mica, silicon carbide, boron nitride, titanium oxide, bismuth oxide, bronze, gold, silver, copper, or nickel.

The other components of the PTFE molded article may include high-permittivity inorganic particles. Examples of the high-permittivity inorganic particles include particles of barium titanate, calcium titanate, strontium titanate, magnesium titanate, lead titanate, zinc titanate, lead zirconate, calcium zirconate, strontium zirconate, barium titanate zirconate, or lead titanate zirconate.

Even in the case where the PTFE molded article contains a resin other than the PTFE and/or the above other components, the proportion of the PTFE in the molded article is preferably 99.0% by mass or higher, more preferably 99.9% by mass or higher.

The PTFE molded article is preferably obtained by heating unsintered PTFE under the conditions where the air contained in the unsintered PTFE is escapes from the unsintered PTFE and the unsintered PTFE is not fully sintered.

The specific heating conditions are appropriately changed depending on the shape and size of the PTFE molded article. The PTFE molded article is preferably obtained by, for example, heating unsintered PTFE at 326° C. to 345° C. for 10 seconds to two hours. The heating temperature is more preferably 330° C. or higher.

The unsintered PTFE is PTFE having never been heated up to 326° C. or higher, preferably PTFE having never been heated up to 300° C. or higher. A method for manufacturing the above-described PTFE molded article including the step of heating unsintered PTFE at 326° C. to 345° C. for 10 seconds to two hours is a novel manufacturing method.

The heating at the above temperature for the given period of time causes the air contained in the unsintered PTFE to escape from the unsintered PTFE, which is presumably the reason that a PTFE molded article having a high permittivity is obtained. Also, the method enables production of a PTFE molded article having a low loss tangent presumably because the unsintered PTFE is not fully sintered.

The heating can be performed using a device such as a salt bath, a sand bath, or a hot air circulating electric furnace. For easy control of the heating conditions, a salt bath is preferably used. Heating in a salt bath is also advantageous in shortening the heating duration within the above range. Such heating in a salt bath can be performed using the apparatus for manufacturing a coated cable disclosed in JP 2002-157930 A, for example.

The molded article is preferably obtained without heating unsintered PTFE to a temperature higher than 345° C. Once heated to a temperature higher than 345° C., the unsintered PTFE may lose its crystallinity, failing to give a PTFE molded article having high crystallinity. In contrast, a PTFE molded article obtained by heating unsintered PTFE at 326° C. to 345° C. for 10 seconds to two hours without heating to a temperature higher than 345° C. retains the crystallinity of the unsintered PTFE at the same level, exhibiting a high permittivity and a low loss tangent.

The degree of sintering of PTFE has been considered to be proportional to the permittivity and the loss tangent. For example, paragraph [0003] of Patent Literature 2 states that semi-sintered PTFE has a higher permittivity and a higher loss tangent than unsintered PTFE, and fully sintered PTFE has an even higher permittivity and an even higher loss tangent.

However, studies made by the inventors of the present invention found that, contrary to the conventional knowledge, heating PTFE under conditions having not been used before gives a loss tangent not much higher than that of unsintered PTFE, while giving a permittivity higher than that of fully sintered PTFE.

This finding is obtained only by utilizing a salt bath, which requires operation skills, and by succeeding in setting the detailed heating conditions that have not been achieved before.

The unsintered PTFE is preferably obtained by paste extrusion molding of a mixture containing unsintered PTFE powder and an extrusion aid. The unsintered PTFE may also be obtained by drying the paste extrudate obtained by paste extrusion molding to remove the extrusion aid. The mixture may be obtained by mixing unsintered PTFE powder and an extrusion aid by a known method, aging the mixture for 1 to 24 hours, and pre-molding the mixture at a pressure of 0.5 to 2.0 MPa. The paste extrusion can be performed at an extrusion pressure of 2 to 100 MPa.

The shape of the PTFE molded article may be any shape that allows the molded article to have the properties required for the dielectric waveguide. The PTFE molded article may have a cross-sectional shape such as a rectangle, circle, ellipse, or circular ring.

The PTFE molded article can be suitably manufactured by the later-described method for manufacturing a dielectric waveguide.

The present invention also relates to a method for manufacturing a dielectric waveguide, comprising the steps of: heating unsintered PTFE at 326° C. to 345° C. for 10 seconds to two hours and thereby forming a PTFE molded article; and manufacturing a dielectric waveguide using the PTFE molded article.

The heating duration for the unsintered PTFE varies depending on the diameter of the unsintered PTFE, the heating temperature, and the facility used for the heating.

For example, in the case where the PTFE has a diameter of 0.1 mm to 6 mm and a salt bath is used for heating, the heating duration is preferably 10 seconds to 10 minutes, more preferably 30 seconds to six minutes.

In the case where the unsintered PTFE has a diameter of 0.1 mm to 6 mm and a hot air circulating electric furnace is used for heating, the heating duration is preferably three minutes to two hours, more preferably 10 minutes to 30 minutes.

In the case where the unsintered PTFE has a diameter of greater than 6 mm to 20 mm and a salt bath is used for heating, the heating duration is preferably one minute to 20 minutes, more preferably three minutes to 10 minutes.

In the case where the unsintered PTFE has a diameter of greater than 6 mm to 20 mm and a hot air circulating electric furnace is used for heating, the heating duration is preferably 10 minutes to two hours, more preferably 30 minutes to one hour.

The manufacturing method preferably includes the steps of:
paste extrusion molding a mixture containing unsintered PTFE powder and an extrusion aid to obtain an unsintered PTFE molded article;
drying the unsintered PTFE molded article to remove the extrusion aid;
heating the dried molded article at 326° C. to 345° C. for 10 seconds to two hours; and
manufacturing a dielectric waveguide using the PTFE molded article.

In the manufacturing method, the heating temperature and the heating duration are appropriately changed within the respective ranges depending on the shape and size of the PTFE molded article and the heating medium (hot air, molten salt such as a 1:1 mixture of potassium nitrate and sodium nitrate, powder such as sand for a sand bath), for example.

The manufacturing method preferably includes no step of heating unsintered PTFE to a temperature higher than 345° C. in achieving a molded article having a high permittivity and a low loss tangent.

The method for manufacturing a dielectric waveguide using the PTFE molded article, varying depending on the properties required for the dielectric waveguide, is described with reference to the later-described experiments, for example.

The first and second dielectric waveguides each preferably comprise the PTFE molded article as a waveguide medium. The first dielectric waveguide is preferably a dielectric waveguide that transmits high-frequency waves such as millimeter waves and submillimeter waves by utilizing the permittivity difference between the dielectrics. The PTFE molded article in the first dielectric waveguide has a high permittivity and a low loss tangent, and can achieve a dielectric waveguide having excellent transmission efficiency when combined with a dielectric having a low permittivity and a low loss tangent.

Examples of the first and second dielectric waveguides include cylindrical dielectric waveguides, tubular dielectric waveguides, image guides, insular-image guides, trapped image guides, rib guides, strip dielectric waveguides, inverted strip dielectric waveguides, H guides, and nonradiative dielectric waveguides (NRD guides).

One embodiment of the first dielectric waveguide is illustrated in FIG. 1. The dielectric waveguide illustrated in FIG. 1 is a cylindrical dielectric waveguide whose cross section is circular. The dielectric waveguide illustrated in FIG. 1 comprises a center dielectric 11 and a dielectric layer 12 surrounding the center dielectric 11. The center dielectric 11 can be formed of the PTFE molded article. The dielectric layer 12 in the first dielectric waveguide can be formed of a material having a lower permittivity than the PTFE molded article. The dielectric waveguide with these components can transmit high-frequency waves such as millimeter waves and submillimeter waves with high efficiency. The dielectric layer 12 can be formed by, for example, winding a stretched PTFE porous material or foamed polyethylene onto the center dielectric 11.

Since the PTFE molded article in the first dielectric waveguide has a high permittivity, formation of the center dielectric 11 using the PTFE molded article enables an increase in the permittivity difference between the center dielectric 11 and the dielectric layer 12. In addition, since the center dielectric 11 in the first dielectric waveguide has a low loss tangent, a dielectric waveguide capable of transmitting high-frequency waves with high efficiency can be achieved.

Although the dielectric waveguide illustrated in FIG. 1 further includes on the outer periphery of the dielectric layer 12 a protective layer 13 for protection of the center dielectric 11 and the dielectric layer 12, the protective layer 13 may or may not be provided. The protective layer 13 can be formed of a material which is used for a protective layer (sheath layer) of an electric wire, such as polyvinyl chloride or a polyolefin.

The first dielectric waveguide preferably comprises the PTFE molded article as the center dielectric. The first dielectric waveguide preferably further comprises a dielectric layer surrounding the center dielectric. In the first dielectric waveguide, the dielectric layer preferably has a permittivity of 1.90 or lower at 2.45 GHz or 12 GHz.

In the first dielectric waveguide, the dielectric layer is preferably formed of a material having a loss tangent of $2.00 \times 10^{-4}$ or lower at 2.45 GHz or 12 GHz. In other words, one preferred mode of the first dielectric waveguide of the present invention is a dielectric waveguide comprising a PTFE molded article functioning as a center dielectric, and a dielectric layer surrounding the center dielectric, wherein the dielectric layer is formed of a material that has a permittivity of 1.90 or lower at 2.45 GHz or 12 GHz and a loss tangent of $2.00 \times 10^{-4}$ or lower at 2.45 GHz or 12 GHz.

The permittivity of the material constituting the dielectric layer in the first dielectric waveguide is more preferably 1.70 or lower, still more preferably 1.50 or lower, particularly preferably 1.30 or lower, while it is preferably 1.03 or higher. The loss tangent of the material constituting the dielectric layer in the first dielectric waveguide is more preferably $1.00 \times 10^{-4}$ or lower, still more preferably $0.60 \times 10^{-4}$ or lower, particularly preferably $0.30 \times 10^{-4}$ or lower. Examples of the material constituting the dielectric layer include stretched PTFE porous materials and foamed polyethylene.

The stretched PTFE porous materials may each be a stretched PTFE porous film obtained by stretching a sheet-like PTFE molded article, or a stretched PTFE porous tube obtained by stretching a tubular PTFE molded article. The stretched PTFE porous material can be produced by a known method. The permittivity and loss tangent of the stretched PTFE porous material can appropriately be controlled by changing the stretching conditions including the stretching ratio, stretching rate, and stretching temperature. For example, the higher the stretching ratio is, the lower the permittivity and the loss tangent are.

Another embodiment of the dielectric waveguide is illustrated in FIG. 2. The dielectric waveguide illustrated in FIG. 2 is an insular-image guide. In the dielectric waveguide illustrated in FIG. 2, a dielectric 21 is disposed on a conductive substrate 23 with a dielectric 22 in between. The dielectric 21 can be formed of the PTFE molded article constituting the first dielectric waveguide. The dielectric 22 can be formed of a material having a lower permittivity than the PTFE molded article constituting the first dielectric waveguide. The dielectric waveguide with these components can transmit high-frequency waves such as millimeter waves and submillimeter waves with high efficiency. Since the PTFE molded article of the first dielectric waveguide has a higher permittivity than conventional PTFE molded articles, even a conventional PTFE molded article is enough as the dielectric 22 to provide a permittivity difference between the dielectric 21 and the dielectric 22. In addition, since the loss tangent of the dielectric 21 is low, a dielectric waveguide capable of transmitting millimeter waves with high efficiency can be achieved. Although not illustrated, a conductive substrate 23 may be further disposed on the dielectric 21. An adhesive layer may be disposed between the dielectric 21 and the dielectric 22 and/or between the dielectric 22 and the conductive substrate 23. The adhesive layer can be formed of a fluorine resin sheet having an adhesive function, for example. Examples of the fluorine resin sheet include sheets made of a tetrafluoroethylene/perfluoro(alkyl vinyl ether) copolymer (PFA) containing adhesive functional groups such as hydroxy, carboxyl, and amino groups.

The dielectric waveguide may also be an image guide (not illustrated). Having a high permittivity and a low loss tangent, the PTFE molded article used as a dielectric of the image guide can give a reduced diameter to the dielectric, thereby miniaturizing the image guide.

Another embodiment of the dielectric waveguide is illustrated in FIG. 3. The dielectric waveguide illustrated in FIG. 3 is a nonradiative dielectric waveguide (NRD guide). The dielectric waveguide illustrated in FIG. 3 comprises a pair of conductive plates 31a and 31b and dielectrics 32 held between the conductive plates 31a and 31b. The dielectrics 32 can each be formed of the PTFE molded article constituting the first dielectric waveguide. Having a high permittivity and a low loss tangent, the PTFE molded article constituting the first dielectric waveguide can give a reduced diameter to the dielectrics 32, thereby miniaturizing the NRD guide. An adhesive layer may be disposed between the conductive plate 31a and the dielectrics 32 and/or between the conductive plate 31b and the dielectrics 32. The adhesive layer can be formed of a fluorine resin sheet having an adhesive function, for example. Examples of the fluorine resin sheet include sheets made of a tetrafluoroethylene/perfluoro(alkyl vinyl ether) copolymer (PFA) containing adhesive functional groups such as hydroxy, carboxyl, and amino groups.

As illustrated in FIG. 4, a dielectric may comprise a dielectric 41 and a dielectric 42 having a lower permittivity than the dielectric 41. In this configuration, input and output of high-frequency waves through the dielectric 42 having a lower permittivity reduces reflection of the high-frequency waves compared with direct input and output of high-frequency waves to the dielectric 41 having a higher permittivity, allowing easy input and output of high-frequency waves. With the dielectric 41 comprising the PTFE molded article that constitutes the first dielectric waveguide and has a higher permittivity than conventional PTFE molded articles, even a conventional PTFE molded article is enough as the dielectric 42 to provide a permittivity difference between the dielectric 41 and the dielectric 42.

Embodiments of the second dielectric waveguide are described with reference to FIGS. 1, 2, and 4.

The dielectric waveguide illustrated in FIG. 1 is a cylindrical dielectric waveguide whose cross section is circular. The dielectric waveguide illustrated in FIG. 1 comprises the center dielectric 11 as a dielectric A, and the dielectric layer 12 surrounding the center dielectric 11 as a dielectric B. The center dielectric 11 is formed of the PTFE molded article. Having a permittivity difference (Δε) between the permittivity εA of the center dielectric 11 and the permittivity εa of the dielectric layer 12, the second dielectric waveguide can transmit high-frequency waves such as millimeter waves and submillimeter waves with high efficiency.

The proper diameter of the center dielectric 11 is determined based on the frequency and the permittivity of the center dielectric. Typically, in the case where the frequency is 1 GHz to 1 THz, the diameter is 0.1 mm to 100 mm.

The dielectric layer 12 can be formed by, for example, winding a material such as a stretched PTFE porous material or foamed polyethylene onto the center dielectric 11.

Although the dielectric waveguide illustrated in FIG. 1 further includes on the outer periphery of the dielectric layer 12 the protective layer 13 for protection of the center dielectric 11 and the dielectric layer 12, the protective layer 13 may or may not be provided. The protective layer 13 can be formed of a material which is used for a protective layer (sheath layer) of an electric wire, such as polyvinyl chloride or polyolefine.

Another embodiment of the dielectric waveguide is illustrated in FIG. 2. The dielectric waveguide illustrated in FIG. 2 is an insular-image guide. In the dielectric waveguide illustrated in FIG. 2, the dielectric 21 functioning as the dielectric A is disposed on the conductive substrate 23 with the dielectric 22 functioning as the dielectric B in between. The dielectric 21 is formed of the PTFE molded article. The conductive substrate 23 may be a metal plate. Having a permittivity difference ($\Delta\varepsilon$) between the permittivity $\varepsilon_A$ of the dielectric 21 and the permittivity $\varepsilon_B$ of the dielectric 22, the second dielectric waveguide can transmit high-frequency waves such as millimeter waves and submillimeter waves with high efficiency. The dielectric 22 can be formed of a material such as a stretched PTFE porous material or foamed polyethylene.

Although not illustrated, the conductive substrate 23 may be further disposed on the dielectric 21. An adhesive layer may be disposed between the dielectric 21 and the dielectric 22 and/or between the dielectric 22 and the conductive substrate 23. The adhesive layer can be formed of a fluorine resin sheet having an adhesive function, for example. Examples of the fluorine resin sheet include sheets made of a tetrafluoroethylene/perfluoro(alkyl vinyl ether) copolymer (PFA) containing adhesive functional groups such as hydroxy, carboxyl, and amino groups.

Another embodiment of the dielectric waveguide is illustrated in FIG. 4. The dielectric waveguide illustrated in FIG. 4 is a nonradiative dielectric waveguide (NRD guide). The dielectric waveguide illustrated in FIG. 4 comprises a pair of conductive plates 43a and 43b, the dielectric 41 as the dielectric A, and the dielectric 42 as the dielectric B. The dielectric 41 and the dielectric 42 are held between the conductive plates 43a and 43b. Since the second dielectric waveguide has a permittivity difference ($\Delta\varepsilon$) between the permittivity $\varepsilon_A$ of the dielectric 41 and the permittivity Ea of the dielectric 42, input and output of high-frequency waves through the dielectric 42 having a lower permittivity reduces reflection of the high-frequency waves compared with direct input and output of high-frequency waves to the dielectric 41 having a higher permittivity, allowing easy input and output of high-frequency waves. The dielectric 41 is formed of the PTFE molded article. The conductive plates 43a and 43b may each be a metal plate.

The dielectric 42 can be formed of a material such as a stretched PTFE porous material or foamed polyethylene. An adhesive layer may be disposed between the conductive plate 43a and the dielectrics 41 and 42 and/or between the conductive plate 43b and the dielectrics 41 and 42. The adhesive layer can be formed of a fluorine resin sheet having an adhesive function, for example. Examples of the fluorine resin sheet include sheets made of a tetrafluoroethylene/perfluoro(alkyl vinyl ether) copolymer (PFA) containing adhesive functional groups such as hydroxy, carboxyl, and amino groups.

The stretched PTFE porous material may be a stretched PTFE porous film obtained by stretching a sheet-like PTFE molded article, or a stretched PTFE porous tube obtained by stretching a tubular PTFE molded article. The stretched PTFE porous material can be produced by a known method. The permittivity and loss tangent of the stretched PTFE porous material can appropriately be controlled by changing the stretching conditions including the stretching ratio, stretching rate, and stretching temperature. For example, the higher the stretching ratio is, the lower the permittivity and the loss tangent are.

EXAMPLES

The present invention is described with reference to experiments. The experiments, however, are not intended to limit the scope of the present invention.

The numerical values in the experiments were measured by the following respective methods.
Permittivity and Loss Tangent (Tan $\delta$)

The permittivity and loss tangent (tan $\delta$) of a cylindrical PTFE molded article, tubular PTFE molded article, or stretched PTFE porous tube were measured by a cavity resonator (2.45 GHz) available from Kanto Electronic Application and Development Inc.

The permittivity and loss tangent (tan $\delta$) of a flat-plate-shaped PTFE molded article or stretched PTFE porous film were measured in accordance with "Microwave measurement of complex permittivity of dielectric plate materials", Prof. Kobayashi (Saitama University), MW87-7.
Hardness The hardness was measured by a spring-type hardness meter (JIS-A shaped) defined in JIS K6301-1975.
Specific Gravity The specific gravity was measured by hydrostatic weighing (in accordance with JIS Z 8807).

Experiment 1

PTFE fine powder (2 kg) whose standard specific gravity (SSG) is 2.175 was mixed with a hydrocarbon-based solvent (400 g), whereby a PTFE paste was prepared.

The PTFE paste was molded by paste extrusion molding using a diameter 2.0 mm extrusion die to obtain a cylindrical unsintered PTFE molded article (A). The obtained PTFE molded article (A) was placed in a hot air circulating electric furnace. The temperature was gradually increased from 100° C. to 250° C. to remove the hydrocarbon-based solvent by evaporation. Thereby, a cylindrical PTFE molded article (B) was obtained.

The obtained cylindrical PTFE molded article (B) was placed in a salt bath (molten salt, 1:1 mixture of potassium nitrate and sodium nitrate) and heated, so that a cylindrical PTFE molded article (C) was obtained. The diameter of the heated cylindrical PTFE molded article was 1.95 mm. The heating temperature, heating duration, and the results of heating are shown in Table 1.

Experiment 2 and Comparative Examples 1 and 2

A cylindrical PTFE molded article was obtained by the same procedure as that in Experiment 1, except that the heating temperature and heating duration were changed as shown in Table 1. The results are shown in Table 1.

Experiment 3

A dried cylindrical PTFE molded article (B) was obtained by the same procedure as that in Experiment 1. The dried cylindrical PTFE molded article (B) was placed in a hot air circulating electric furnace and heated. The heating temperature, heating duration, and the results of heating are shown in Table 1.

Experiment 4

PTFE fine powder (2 kg) whose standard specific gravity (SSG) is 2.175 was mixed with a hydrocarbon-based solvent (400 g), whereby a PTFE paste was prepared.

The PTFE paste was extruded onto a diameter 0.511 mm silverplated copper-coated steel wire by paste extrusion molding using a diameter 2.2 mm extrusion die to obtain a PTFE-coated metal wire. The PTFE-coated metal wire was placed in a hot air circulating electric furnace. The temperature was gradually increased from 100° C. to 250° C. to remove the hydrocarbonbased solvent by evaporation.

The dried PTFE-coated metal wire was placed in a salt bath and heated. The heating temperature and heating duration are shown in Table 1.

The heated PTFE-coated metal wire was cut to about 2 m. The silver-plated copper-coated steel wire alone was pulled out such that the silver-plated copper-coated steel wire and the PTFE coating were separated. Thereby, a tubular (cylindrical) PTFE molded article was obtained. The properties of the PTFE molded article are shown in Table 1.

Experiment 5

PTFE fine powder (2 kg) whose standard specific gravity (SSG) is 2.160 was mixed with a hydrocarbon-based solvent (600 g), whereby a PTFE paste was prepared.

The PTFE paste was molded by paste extrusion molding using a diameter 16 mm extrusion die to obtain a cylindrical PTFE molded article.

The cylindrical PTFE molded article was further molded by roll molding using calender rolls, so that a flat-plate-shaped PTFE molded article (D) having a thickness of 1.0 mm was obtained.

The resultant flat-plate-shaped PTFE molded article (D) was placed in a hot air circulating electric furnace. The temperature was gradually increased from 100° C. to 250° C. to remove the hydrocarbon-based solvent by evaporation. Thereby, a flat-plate-shaped PTFE molded article (E) was obtained.

The flat-plate-shaped PTFE molded article (E) was cut to a size of 100 mm×150 mm, immersed in a salt bath, and heated, so that a flat-plate-shaped PTFE molded article (F) was obtained. The heating temperature, heating duration, and the results of heating are shown in Table 1.

Experiment 6

The flat-plate-shaped PTFE molded article (E) obtained in Experiment 5 was stretched in the longitudinal direction with a stretching ratio of 5 by a uniaxial stretcher at 250° C. Thereby, a stretched PTFE porous film G (thickness: 200 µm) was obtained.

The permittivity and loss tangent of the obtained stretched PTFE porous film G measured by cylindrical conductor cavity resonance method were 1.41 and $0.4 \times 10^{-4}$, respectively.

Experiment 7

A stretched PTFE porous film H was obtained by the same procedure as that in Experiment 6, except that the stretching ratio was changed to 15. The permittivity and the loss tangent measured by cylindrical conductor cavity resonance method were 1.07 and $0.1 \times 10^{-4}$, respectively.

Experiment 8

PTFE fine powder (2 kg) whose standard specific gravity (SSG) is 2.175 was mixed with a hydrocarbon-based solvent (410 g), whereby a PTFE paste was prepared.

The PTFE paste was paste extrusion molded using a diameter 6.2 mm extrusion die and a 2.2 mm core pin to obtain a tubular unsintered PTFE molded article. The obtained tubular unsintered PTFE molded article was placed in a hot air circulating electric furnace. The temperature was gradually increased from 100° C. to 250° C. to remove the hydrocarbon-based solvent by evaporation.

The dried tubular unsintered PTFE molded article was stretched in the longitudinal direction with a stretching ratio of 5 by a uniaxial stretcher at 250° C. Thereby, a stretched PTFE porous tube I (outer diameter: 6.0 mm, inner diameter: 2.0 mm) was obtained.

The permittivity and loss tangent of the obtained stretched PTFE porous tube I measured by cylindrical conductor cavity resonance method were 1.20 and $0.3 \times 10^{-4}$, respectively.

Experiment 9

The stretched PTFE porous film G (permittivity: 1.41, loss tangent: $0.4 \times 10^{-4}$) obtained in Experiment 6 as the dielectric layer was cut into a 5-mm width tape. The tape was wound onto the cylindrical PTFE molded article C (permittivity: 2.14, diameter: 1.95 mm) obtained in Experiment 1 as the center dielectric. Thereby, a hybrid HE11

TABLE 1

| | Heating temperature (° C.) | Heating duration (min) | Specific gravity | Hardness | Permittivity | Loss tangent ($\times 10^{-4}$) | Measurement frequency (GHz) |
|---|---|---|---|---|---|---|---|
| Experiment 1 | 340 | 5 | 2.211 | 98 | 2.14 | 1.01 | 2.45 |
| Experiment 2 | 345 | 1.5 | 2.228 | 98 | 2.15 | 0.95 | 2.45 |
| Experiment 3 | 334 | 60 | 2.230 | 99 | 2.19 | 0.93 | 2.45 |
| Experiment 4 | 340 | 5 | 2.207 | 99 | 2.13 | 0.97 | 2.45 |
| Experiment 5 | 340 | 5 | 2.210 | 99 | 2.14 | 0.94 | 12 |
| Comparative Example 1 | 320 | 5 | 1.650 | 70 | 1.71 | 0.50 | 2.45 |
| Comparative Example 2 | 360 | 1 | 2.165 | 98 | 2.10 | 2.20 | 2.45 | mode cylindrical dielectric waveguide was obtained which had a thickness of 2.0 mm, a permittivity difference Δε between the center dielectric and the dielectric layer of 0.73, and a diameter of 6.0 mm.

Experiment 10

The cylindrical PTFE molded article C (permittivity: 2.14, diameter: 1.95 mm) obtained in Experiment 1 as the center dielectric was inserted into the stretched PTFE porous tube I (permittivity: 1.20, loss tangent: $0.3 \times 10^{-4}$) obtained in Example 8 as the dielectric layer. Thereby, a hybrid HE11 mode cylindrical dielectric waveguide was obtained which had a permittivity difference Δε between the center dielectric and the dielectric layer of 0.94 and a diameter of 6.0 mm.

Experiment 11

The stretched PTFE porous film H (permittivity: 1.07, loss tangent: $0.1 \times 10^{-4}$) obtained in Experiment 7 as the dielectric layer was cut into a 5-mm-width tape. The tape was wound onto the cylindrical PTFE molded article (permittivity: 2.19, diameter: 1.95 mm) obtained in Experiment 3 as the center dielectric. Thereby, a hybrid HE11 mode cylindrical dielectric waveguide was obtained which had a thickness of 2.0 mm, a permittivity difference Δε between the center dielectric and the dielectric layer of 1.12, and a diameter of 6.0 mm.

Experiment 12

An insular image guide having the following layer structure was prepared.
First layer: copper foil (conductive substrate) Second layer: PFA sheet with adhesive function (thickness: 12.5 μm)
Third layer: flat-plate-shaped PTFE molded article (F) (permittivity: 2.14) obtained in Experiment 5
Fourth layer: PFA sheet (thickness: 12.5 μm) with adhesive function
Fifth layer: stretched PTFE porous film G (permittivity: 1.41, loss tangent: $0.4 \times 10^{-4}$) obtained in Experiment 6 Sixth layer: PFA sheet (thickness: 12.5 μm) with adhesive function Seventh layer: copper foil (conductive substrate)
The materials of the seven layers were stacked and press-bonded by 310° C. pressing for 10 minutes at a pressure of 1.0 MPa. The first layer, the seventh layer, and part of each layer were removed by etching, whereby a HE11 mode insular image guide was obtained.

REFERENCE SIGNS LIST 11 center dielectric
12 dielectric layer
13 protective layer
21, 22 dielectric
23 conductive substrate
31a, 31b, 43a, 43b conductive plate
32, 41, 42 dielectric

The invention claimed is:

1. A dielectric waveguide comprising
a polytetrafluoroethylene molded article that has a permittivity of 2.05 or higher at 2.45 GHz or 12 GHz, a loss tangent of $1.20 \times 10^{-4}$ or lower at 2.45 GHz or 12 GHz, and a hardness of 95 or higher,
wherein the hardness is measured by a spring-type hardness meter (JIS-A shaped) defined in JIS K6301-1975.

2. The dielectric waveguide according to claim 1,
wherein the polytetrafluoroethylene molded article is obtained by heating unsintered polytetrafluoroethylene at 326° C. to 345° C. for 10 seconds to two hours.

3. The dielectric waveguide according to claim 1, further comprising
a dielectric layer surrounding the polytetrafluoroethylene molded article, the polytetrafluoroethylene molded article functioning as a center dielectric,
wherein the dielectric layer is formed of a material that has a permittivity of 1.90 or lower at 2.45 GHz or 12 GHz and a loss tangent of $2.00 \times 10^{-4}$ or lower at 2.45 GHz or 12 GHz.

4. The dielectric waveguide according to claim 1, further comprising
a conductive substrate, and
a dielectric formed of a material having a lower permittivity than the polytetrafluoroethylene molded article,
wherein the polytetrafluoroethylene molded article is disposed on the conductive substrate with the dielectric in between.

5. The dielectric waveguide according to claim 1, further comprising
a pair of conductive plates,
wherein the polytetrafluoroethylene molded article is held between the conductive plates.

6. A method for manufacturing a dielectric waveguide, comprising the steps of:
heating an unsintered polytetrafluoroethylene molded article at 326° C. to 345° C. for 10 seconds to two hours and thereby forming a polytetrafluoroethylene molded article; and
manufacturing a dielectric waveguide using the polytetrafluoroethylene molded article,
wherein the proportion of the polytetrafluoroethylene in the polytetrafluoroethylene molded article is 99.0% by mass or higher.

7. A dielectric waveguide comprising:
a dielectric A; and
a dielectric B having a lower permittivity than the dielectric A,
the dielectric A being formed of a polytetrafluoroethylene molded article,
the dielectric waveguide having a Δε value, determined from $\Delta\varepsilon = \varepsilon_A - \varepsilon_B$, of 0.70 or higher,
wherein $\varepsilon_A$ represents a permittivity of the dielectric A at 2.45 GHz or 12 GHz, $\varepsilon_B$ represents a permittivity of the dielectric B at 2.45 GHz or 12 GHz, and Δε represents a permittivity difference between the dielectric A and the dielectric B,
wherein the dielectric A is in contact with the dielectric B,
wherein the proportion of the polytetrafluoroethylene in the polytetrafluoroethylene molded article is 99.0% by mass or higher.

8. The dielectric waveguide according to claim 7, which has a Δε value of 0.90 or higher.

9. The dielectric waveguide according to claim 7,
wherein $\varepsilon_A$ is 2.05 or higher.

10. The dielectric waveguide according to claim 7,
wherein the dielectric A has a loss tangent of $1.20 \times 10^{-4}$ or lower at 2.45 GHz or 12 GHz and a hardness of 95 or higher,
wherein the hardness is measured by a spring-type hardness meter (JIS-A shaped) defined in JIS K6301-1975.

* * * * *